(12) United States Patent
Vaganov et al.

(10) Patent No.: US 7,659,182 B2
(45) Date of Patent: Feb. 9, 2010

(54) METHOD OF WAFER-TO-WAFER BONDING

(76) Inventors: Vladimir Vaganov, 129 El Porton, Los Gatos, CA (US) 95032; Nickolai Belov, 118 Plazoleta, Los Gatos, CA (US) 95032

(*) Notice: Subject to any disclaimer, the term of this patent is extended or adjusted under 35 U.S.C. 154(b) by 0 days.

(21) Appl. No.: 11/804,863

(22) Filed: May 21, 2007

(65) Prior Publication Data
US 2008/0070376 A1 Mar. 20, 2008

Related U.S. Application Data

(60) Provisional application No. 60/802,374, filed on May 23, 2006.

(51) Int. Cl.
*H01L 21/00* (2006.01)
(52) U.S. Cl. ............... 438/455; 438/106; 257/E23.001
(58) Field of Classification Search .............. 438/106, 438/455; 65/35, 36, 305; 117/1; 156/60; 228/4.1, 5.5, 106; 257/E23.001
See application file for complete search history.

(56) References Cited

U.S. PATENT DOCUMENTS

2003/0109183 A1* 6/2003 Mastromatteo et al. ..... 439/894
2006/0292823 A1* 12/2006 Ramanathan et al. ....... 438/455
2007/0090479 A1* 4/2007 Chen et al. .................. 257/433
2007/0181633 A1* 8/2007 Erlach ........................ 228/5.5

OTHER PUBLICATIONS

Vladimir Vaganov, Nickolai Belov, Hout, "Three Dimensional Bonding Technologies for MEMS" presented at SPIE 2003.
Int'l Searching Authority, International Search Report and Written Opinion of the International Searching Authority for PCTUS0711989, mailed Aug. 20, 2008, 12 pages (86920PCT).

* cited by examiner

*Primary Examiner*—Matthew Smith
*Assistant Examiner*—Michele Fan
(74) *Attorney, Agent, or Firm*—Fitch, Even, Tabin & Flannery

(57) ABSTRACT

Methods of wafer-to-wafer bonding are disclosed. These methods use a force-transposing substrate providing redistribution of the applied force to the local bonding areas across the wafer. Certain versions of the Present Invention also provide a compliant force-distributing member along with applying bonding material to bonding areas in select locations. A predetermined sequence of external force loading and temperature steps ensure creating bonds between the wafers in the bonding areas. The disclosed methods improve wafer bonding, by increasing its uniformity and strength across the wafer, increasing both reproducibility and yield process and decreasing cost of semiconductor and MEMS devices.

33 Claims, 12 Drawing Sheets

(a)

(b)

METHOD OF WAFER-TO-WAFER BONDING

CROSS REFERENCES TO RELATED APPLICATIONS

This application claims the benefit of U.S. provisional application 60/802,374, filed May 23, 2006 and which is incorporated herein by reference in its entirety and for all purposes.

BACKGROUND OF THE INVENTION

1. Field of the Invention

This invention relates to fabrication of semiconductor devices, Micro Electro Mechanical Systems (MEMS) devices, and more specifically to wafer bonding in fabrication of these devices.

2. Background

Wafer-to-wafer bonding is widely used in fabrication of different MEMS devices including sensors, actuators and micromechanical structures.

There are several types of bonding process known in the art (see "Three-Dimensional Bonding Technologies for MEMS", Vladimir Vaganov, Nickolai Belov, Sebastiaan in't Hout presented at SPIE 2003): fusion bonding, bonding with plasma assisted surface activation, anodic bonding, frit glass bonding, metal bonding, deformation welding, soldering, eutectic bonding, and a wide group of bonding processes that can be referred as polymer or adhesive bonding. Polymer bonding utilizes a wide spectrum of bonding materials that have strong adhesion to material of the wafers, typically, silicon, or to a surface layers formed on the wafers Selection of the bonding method and material is often dictated by the nature of the device and application. Besides general requirements to the bonding, like high bond strength, chemical stability of the bond, environmental protection of the encapsulated structure, long-term stability, thermal budget, etc.

Additional specific requirements include:

Bonding should be uniform across the wafer and reproducible from wafer to wafer, independently on wafer thickness, total thickness variation, bow, non-flatness, non-parallelism, profile formed on the wafers, thickness and non-uniformity of the bonding layer across the wafer, its mechanical parameters, bonding area and other variables.

Often bonding material should have low Young modulus for minimizing the induced or residual stresses in the wafers after bonding.

In some cases there might be additional requirements to electrical or thermal conductivity of the bonding material.

For all bonding processes, which require application of an external mechanical load, a threshold level of mechanical stress at the bonding surfaces is required. This threshold stress $\sigma_t$ often in combination with temperature initiates, activates and stimulates the successful flow of the bonding process. Usually the higher the stress above the threshold—the shorter the process and more uniform the bonding is. However, the downside is the higher level of residual stress in the microstructures induced by larger force and higher temperature. Therefore the applied load during the bonding should be optimized: minimized to avoid damage and residual stress, on one hand, while providing a required stress exceeding the threshold, on the other hand.

One of the conventional assumptions of "ideal" bonding process is that the total thickness variation (TTV) and the surface roughness of the bonding wafers are small enough for a sufficiently good bond. This assumption results in conclusion that required uniformity of mechanical stress in the bonding areas across the wafer is achieved. As shown below this is not the case.

FIG. 1 illustrates an example of the bonding, which conditions assumed "ideal".

The external force 33 is applied by "flat" heated platens 6 and 8 to the outer surfaces 14 and 16 of the dummy substrates 5 and 7, which are also assumed to be ideally flat. Heated platens 6 and 8 are ideally parallel to each other and dummy substrates 5 and 7 are also ideally flat and have constant thickness. The force is transferred through these dummy substrates from the inner surface 18, 20 of the dummy substrates to the outer surfaces 22, 24 of the bonding wafers 2, 4 and through the thickness of the bonding wafers to the bonding surfaces 30, 32. If all the surfaces are ideally flat then external force will be uniformly distributed to the bonding areas across the whole wafer and as soon as the stress in the bonding areas reaches the threshold value (plus temperature contribution to the surface activation) the uniform bonding will occur.

In reality all the surfaces: platens, dummy substrates, bonding wafers are not ideally flat. It means that being brought in physical contact any two surfaces will contact each other in certain number of relatively small contact areas (or contact points) which distribute stresses across the two surfaces non-uniformly. In case of non-ideal surfaces the external force applied to platens 6 and 8 in FIG. 1 will be transferred not uniformly to the inner surfaces of the dummy wafers 5 and 7. For the same reason it would be randomly on the surface and unequally, corresponding to profile of the wafer stack due to TTV distributions and roughness of two contacting surfaces, transferred to the bonding areas 30 and 32 of the bonding wafers. Of course, with some limitations, by increasing the external force one can achieve the required bonding conditions in all bonding areas. However, that comes with a price, the quality of bonding will be different in different wafer areas and induced residual stresses after bonding will be greater.

FIG. 2 illustrates an example of real conditions of the bonding. The external force 33 is applied by non-flat and "rough" surfaces 10, 12 of the heated platens 6, 8 to the outer surface 14, 16, which are also non-flat and rough, of the dummy substrates 5 and 7. These two pairs of surfaces are contacting each other in contact areas 9, 11, 13 and 19, 21 correspondingly. The force through these contact points is transferred to the inner surface of the dummy substrates, which is also non-flat and rough and contacting to the outer surfaces of the bonding wafers 2 and 4, which also have their own non-flatness and roughness creating together a different distribution of the physical contact points. In FIG. 2 the inner surfaces of the dummy wafers and the outer surfaces of the bonding wafers are skipped for simplicity. Only final non-flat and rough inner surfaces 26 and 28 of the bonding wafers 2 and 4 are shown in the center of FIG. 2. These two surfaces of the bonding wafers are contacting in the areas 15 and 17. These contact areas and their distribution across the wafers do not correlate with the position and layout of the bonding areas 29, 31 and 30, 32 on the surfaces 26 and 28 of the bonding wafers 2 and 4. It is obvious that through the thickness of the bonding wafers (and dummy wafers if they participate) the external force 33 will be randomly transferred to the bonding surfaces 26 and 28. In these conditions it is hard to expect a uniform and reproducible bonding in the areas 29, 31 and 30, 32 across the wafer and from wafer to wafer. This is a challenge, which different wafer bonding processes are facing in practice.

Another conventional assumption is that bonding wafers and other substrates participating in the bonding process are rigid to provide complete and uniform transferring of the external force applied by platens to the bonding surface. In reality it is not so. Silicon is an excellent elastic material and it is capable to transfer a local force applied to one surface of the wafer trough the thickness of the wafer to the other surface of the wafer non-uniformly. If two even ideally flat wafers 2 and 4 bring in physical contact and then apply a force 34, 35, 36 in discrete points on the top wafer 2, then the distribution of the stress 3 on the surface of wafers contact will look qualitatively, as shown in FIG. 3. The maximum stress σ will be achieved in the area close to points 37 38 and 39 at the contact surface, as shown in FIG. 3. Point 38 corresponds to zero coordinate on X-axis on the graph. The larger the distance along the contact surfaces of the wafers from the points 37, 38, 39 the lower the stress at the contact surfaces will be. At some points X1, X2, X3, X4, X5 and X6 the stress might drop below the threshold stress $\sigma_t$. It means that the areas between X1 and X2, between X3 and X4 and also between X5 and X6 would have enough stress for successful bonding. All the rest areas of the wafers would not be bonded if one would try to bond two wafers across their entire surfaces. This figure illustrates that elastic silicon can transfer a concentrated force locally into a certain areas.

This consideration along with understanding of the non-uniform transferring of the external force to the bonding surface creates the need for better and higher quality wafer-to-wafer bonding processes providing higher yields in fabrication of semiconductor and MEMS devices.

SUMMARY OF THE INVENTION

The present invention discloses methods of wafer-to-wafer bonding. These methods comprise the steps of: providing bonding wafers, providing at least one force-transposing substrate comprising connecting substrate and transposers having contacting areas; providing at least one compliant force-distributing member; applying bonding material to at least one of the wafers and creating predetermined bonding areas in selected locations; aligning at least two wafers for bonding and at least one force-transposing substrate; applying at least one compliant force-distributing member to force-transposing substrate; providing a predetermined sequence of external force loading and temperature steps for creating bonds between the wafers in the bonding areas.

The disclosed methods improve bonding, by increasing its uniformity and strength across the wafer, increase reproducibility and yield of the process and decrease cost of semiconductor and MEMS devices.

DETAILED DESCRIPTION OF THE PREFERRED EMBODIMENTS

An object of the present invention is to provide a method of uniform and reproducible wafer-level bonding.

Another object of the present invention is to provide a method of wafer bonding that decreases residual stress induced in the bonded wafer stack during the bonding process.

Another object of the present invention is to provide a low-cost method of wafer bonding.

Another object of the present invention is to decrease requirements for both total thickness variation (TTV) and surface roughness of the bonding wafers while providing uniform and reproducible bonding.

Another object of the present invention is to provide a robust method of wafer bonding.

Another object of the present invention is to provide a method of wafer bonding that requires low-bonding force.

Another object of the present invention is to provide a high-throughput method of wafer bonding.

Another object of the present invention is to provide a method of wafer bonding for high-volume applications.

Another object of the present invention is to provide a method of wafer bonding applicable to different types of bonding processes.

Another object of the present invention is to provide a method of wafer bonding with improved control of the process parameters.

The detailed description of the wafer bonding method according to the present invention is presented below in five embodiments.

First Embodiment

Figure 1:
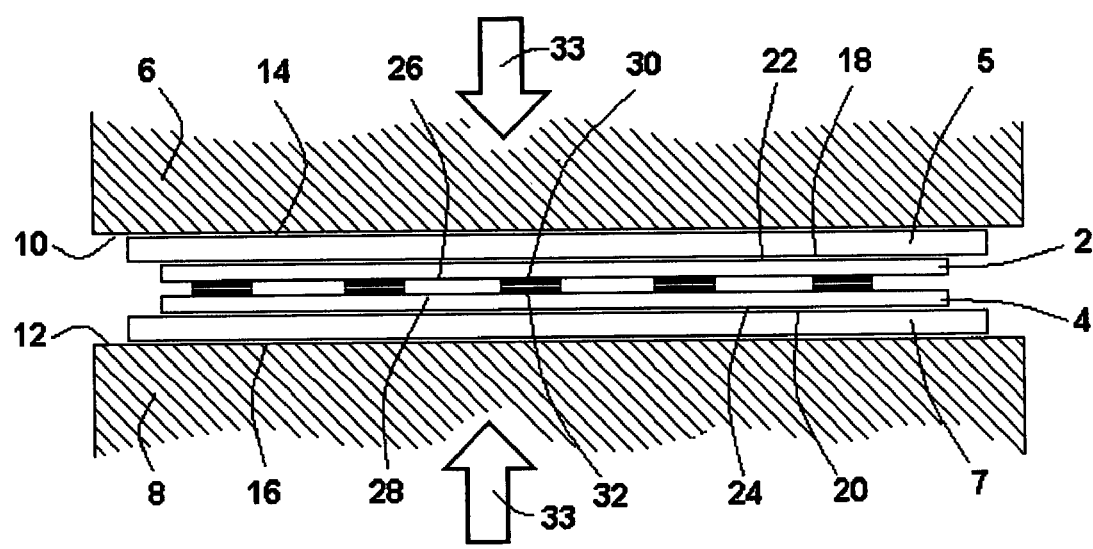
FIG. 1 shows an idealized bonding sandwich during wafer bonding process.
Figure 2:
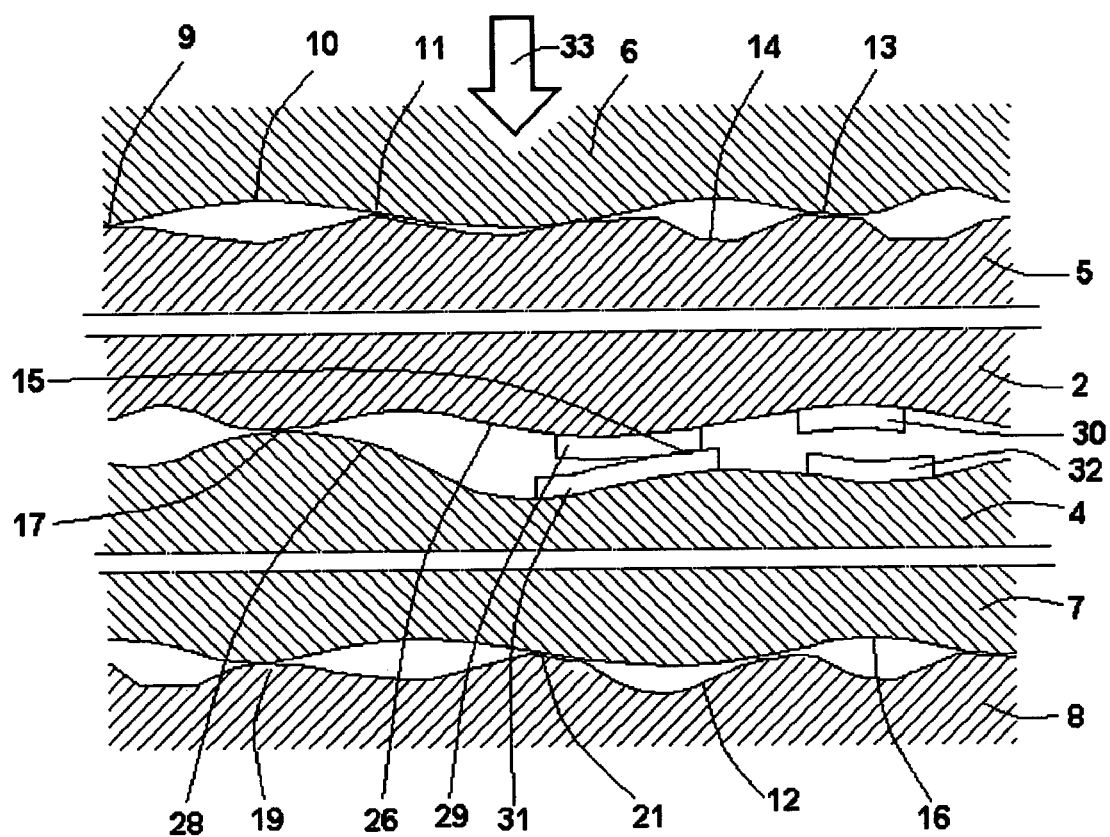
FIG. 2 illustrates interfaces of a real bonding sandwich during wafer bonding process.
Figure 3:
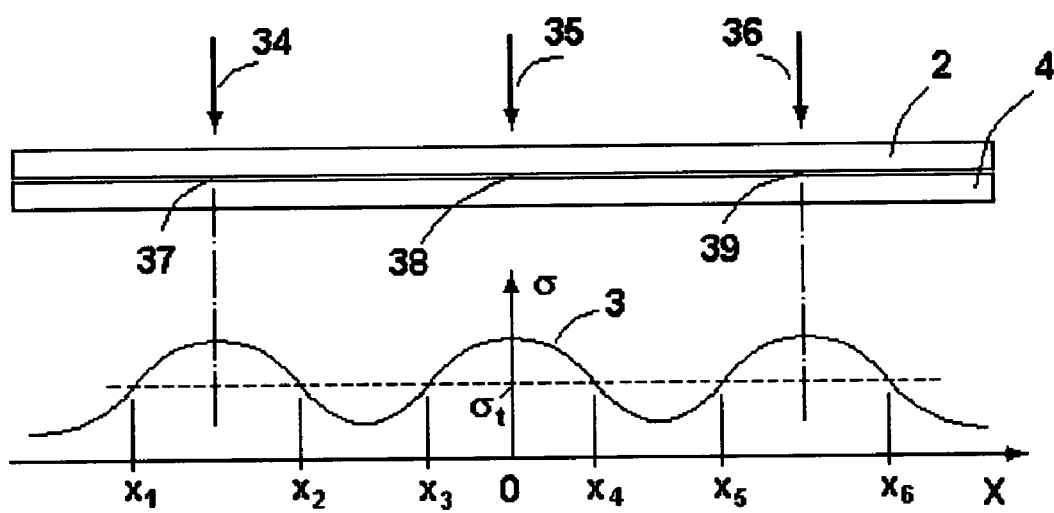
FIG. 3 illustrates qualitatively the stress distribution at the interface of bonding wafers in case of loading the bonding sandwich by a force applied in multiple local points.
Figure 4:
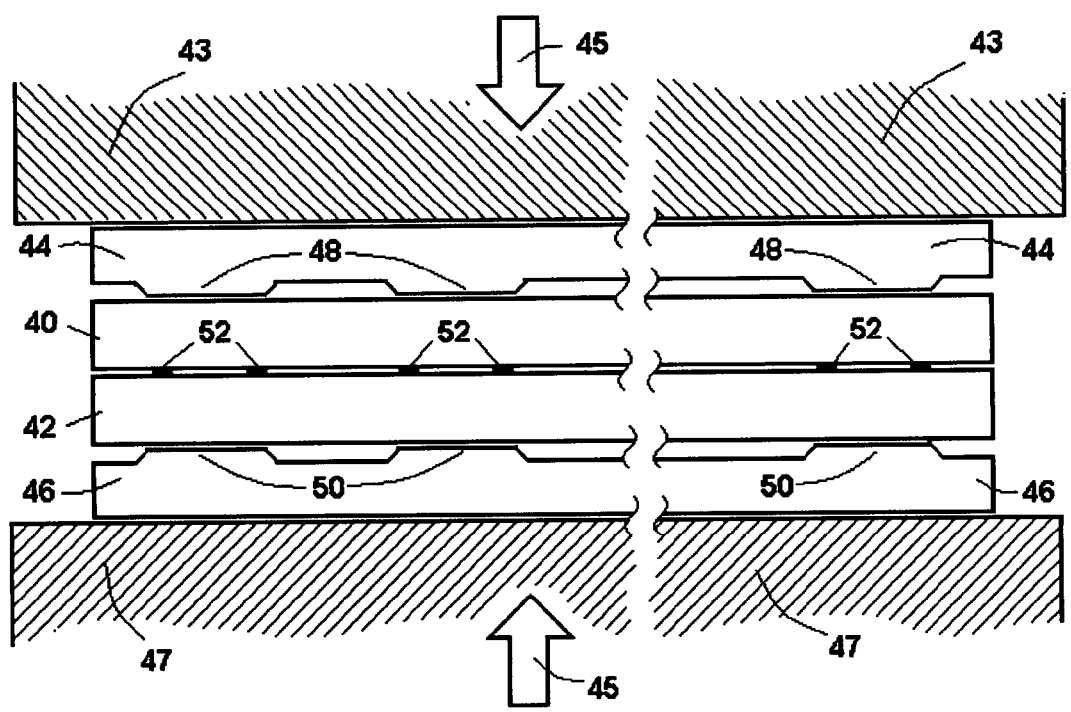
FIG. 4 shows bonding sandwich formed by two wafers aligned for bonding and two micromachined force-transposing substrates.
Figure 5:
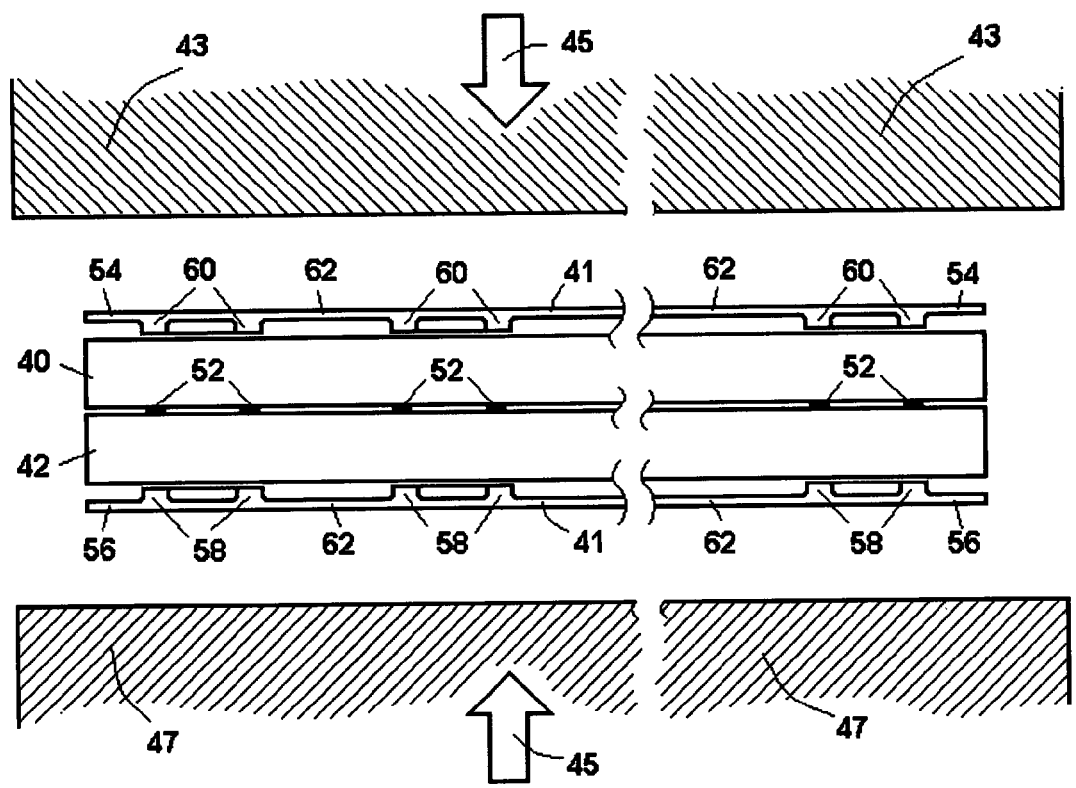
FIG. 5 shows bonding sandwich formed by two wafers aligned for bonding and two stamped force-transposing substrates.
Figure 6:
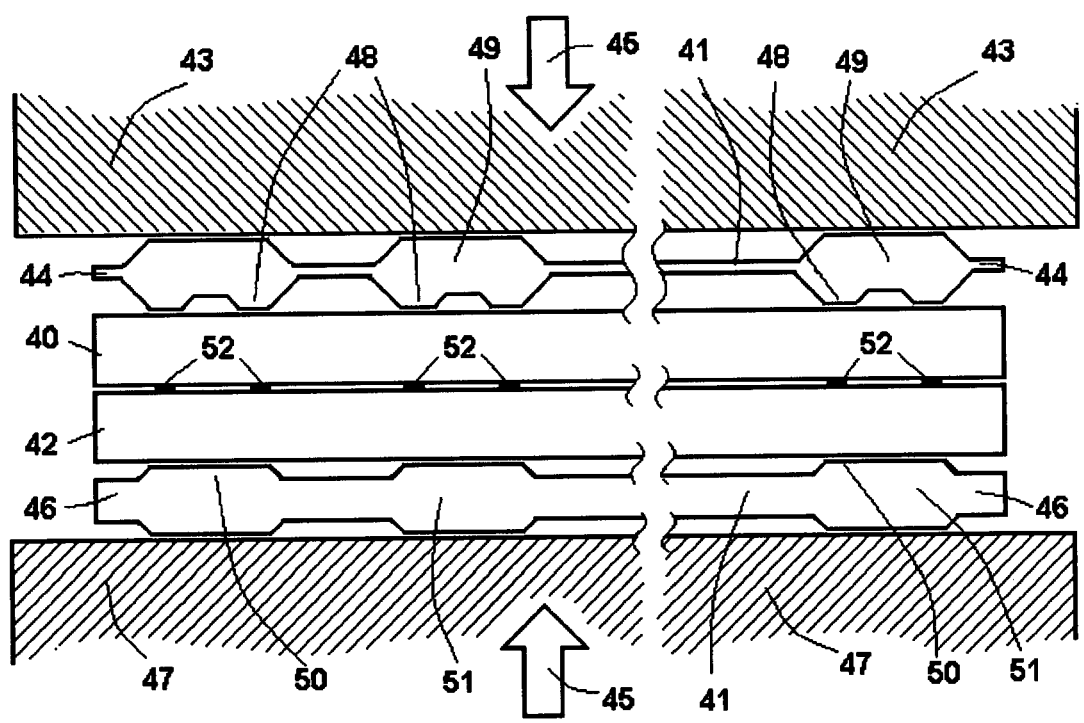
FIG. 6 shows bonding sandwich formed by two wafers aligned for bonding and two micromachined force-transposing substrates having profile on opposite sides.

The method of wafer-to-wafer bonding according to the first embodiment is illustrated by FIGS. 4-6. According to this embodiment, at least two wafers are provided for bonding—the bonding wafers; bonding material is deposited on at least one of the wafers and bonding areas are defined by patterning of the bonding material. After that bonding sandwich is formed by aligning bonding wafers, bringing them in contact and fixing. At least one force-transposing substrate is added to the bonding sandwich at the next step.

The force-transposing substrate has a set of transposers and connecting substrate. Transposers are solid bodies having contact areas located on the surface of the force-transposing substrate. The area around transposers is a connecting substrate, which is thinner than transposers. Thus, mechanical contact between force-transposing substrate and bonding wafers occurs only in contact areas of transposers. Layout of the contact areas of transposers corresponds to the layout of the bonding areas on the bonding wafers. As the total bonding area on the wafer is usually only a small fraction of the wafer area, applying force with a profiled force-transposing substrate compared to a flat substrate will proportionally increase the uniformity of the applied force to each bonding area across the bonding wafer. Therefore, the applied external force is transposed only to the local bonding areas on the surface of the bonding wafers. Therefore, force-transposing substrate serves as load re-distributor across the wafer surface during the bonding process.

The force-transposing substrate is aligned with the bonding wafers and after that wafer bonding is accomplished by creating conditions (temperature, pressure, stress uniformity, as functions of time, etc.), which result in uniform and reproducible bonds between the bonding wafers. The force-transposing substrate is not bonded to the bonding wafers and can be reused.

Different combinations of the above-listed steps are used in different bonding processes. For example, patterning of the bonding material can be omitted if at least one of the bonding wafers is profiled and bonding areas are defined by high areas in the profile. In another example force-transposing substrate can be aligned and attached to at least one of the bonding wafer either before or after aligning the bonding wafers.

FIG. 4 shows an example of bonding wafer sandwich according to the first embodiment. Aligned pair of bonding wafers 40 and 42 is in contact with each other through a layer of bonding material 52. The bonding material 52 can be a polymer, an adhesive, a metal, an alloy, a solder, a frit glass or combination of the above.

Bonding material 52 is deposited on at least one bonding wafer prior to bonding. The deposition is done using different techniques. In particular, bonding material is deposited using spinning, spraying, screen printing, contact printing, sputtering, evaporation, electroplating, chemical vapor deposition, electroless chemical deposition, electrophoresis, laser assisted deposition, dispensing, centrifuging, dropping, dipping, application of bonding material in the form of film and combination of these processes.

In some cases, as for example in polymer bonding, adhesive bonding or frit glass bonding, deposition of the bonding material could be done only on one wafer surface for each pair of wafer surfaces that has to be bonded. In other cases, as for example in deformation welding bonding and soldering, materials utilized in the bonding process should be deposited on both bonding wafers.

Patterning of the bonding material defines bonding area on each chip. In order to increase strength and uniformity of bonding across the wafer, the invented method of wafer-to-wafer bonding provides bonding patterns not only on all chip areas, but also on the periphery of the wafer not occupied by chips, in the areas occupied by test patterns and alignment marks and in all other areas not covered by chips. The same or similar bonding patterns are used in all areas. This provides more uniform force distribution at the wafer-bonding step and yields in better bonding.

Two profiled force-transposing substrates 44 and 46 are aligned with the bonding wafers 40 and 42, as shown in FIG. 4. The transposers 48 and 50 formed on the force-transposing substrates are aligned with the bonding areas 52.

Both an external force 45 and temperature are applied to the platens 43 and 47 of the bonder. Platens 43 and 47 are contacting the bonding sandwich containing bonding wafers 40, 42 and two profiled force-transposing substrates 44 and 46. Due to alignment of transposers 48, 50 and bonding areas 52 a force 45 applied to the platens 43 and 47 is transferred uniformly to the bonding areas 52 resulting in uniform and reproducible bonding between wafers 40 and 42. The described bonding method results in low built-in stress in the bonded wafers 40, 42 due to smaller force required for high-quality bonding.

Force-transposing substrates 44 and 46 shown in FIG. 4 are silicon wafers micromachined from one side. Other than silicon materials are also used for fabrication of the force-transposing substrates.

FIG. 5 shows bonding sandwich consisting of bonding wafers 40, 42 aligned to each other. Force-transposing substrates 54 and 56 are made from metal. These substrates can either be profiled metal sheets, foil or plates. Metal substrates 54 and 56 have transposers 58, 60 connected by connecting substrate 41. Transposers are aligned with the bonding areas 52, which are located at the interface between wafers 40 and 42. The transposers 58, 60 can be formed using stamping, etching, machining, plating or other methods known in the art. When an external force 45 is applied to the platens 43 and 47 then the platens 43 and 47 are contacting the bonding sandwich containing bonding wafers 40, 42 and two profiled force-transposing substrates 54 and 56 and transposers 58, 60 uniformly transfer the external force 45 to the bonding areas 52 resulting in uniform and reproducible bonding between the wafers 40 and 42.

FIG. 6 shows bonding sandwich consisting of bonding wafers 40, 42 aligned to each other and double side profiled force-transposing substrates 44 and 46. Force-transposing substrates 44 and 46 have transposers 49, and 51 connected by connecting substrate 41. The profile 48 of the transposer 49 on the top force-transposing substrate 44 and profile 50 of the transposer 51 on the bottom force-transposing substrate 46 are aligned with the bonding areas 52 located at the interface between bonding wafers 40 and 42. When an external force 45 is applied to the platens 43 and 47 then the platens 43 and 47 are contacting only with transposers 49 and 51 of the force-transposing substrates 44 and 46 correspondingly. This allows better transferring of the force 45 from the platens to the bonding wafers 40 and 42. Due to alignment of transposers 49, 51 and bonding areas 52 the force 45 is transferred uniformly to the bonding areas 52 resulting in uniform and reproducible bonding between wafers 40 and 42.

In many MEMS applications at least of the wafers to be bonded has a profiled surface. An aspect of the embodiment micromachining of at least one of the bonding wafers is used to create microstructures similar to transposers described in the above embodiment. The microstructures serve as external load re-distributor across the wafer surface during the bonding process and allow eliminating the force-transposing substrate. It reduces the cost of the process.

Second Embodiment

Uniformity of the load applied to the wafer sandwich during the bonding process is very important. It is difficult to provide the required high level of flatness and parallelism between the platens and the wafer sandwich in wafer bonding equipment. Besides, direct contact between neither bonding wafers nor force-transposing substrate and platens is desirable. Most of semiconductor materials are brittle. Therefore, direct contact with the platens may cause damage of the bonding wafers and force-transposing substrates. The method of wafer-to-wafer bonding described in the second embodiment addresses these issues.

The method of wafer-to-wafer bonding according to the second embodiment requires at least two wafers provided for bonding (bonding wafers), bonding material is deposited on at least one of the wafers and patterned defining bonding areas. After that bonding sandwich is formed by aligning bonding wafers, bringing them in contact and fixing. At least one profiled force-transposing substrate and at least one compliant force-distributing member is added to the bonding sandwich at the next step. The force-transposing substrate has a set of transposers and connecting substrate. Transposers have contact areas. Layout of the contact areas corresponds to the layout of the bonding areas on the bonding wafers. Mechanical contact between force-transposing substrate and bonding wafers occurs only in contact areas of transposers. Therefore, transposers transfer an external force applied to the bonding sandwich to the local areas on the bonding wafers. The force-transposing substrate is aligned to the bonding wafers in such a way that transposers are aligned to the bonding areas. The force-distributing member is applied to the force-transposing substrate. When loaded with a force, material of the compliant force-distributing member is redistributing in the direction of stress gradient. Uniform and reproducible wafer bonding is achieved by applying temperature and force to the bonding sandwich with required ramping and uniformity of the parameters.

Different combinations of the above-listed steps are used.

Figure 7:
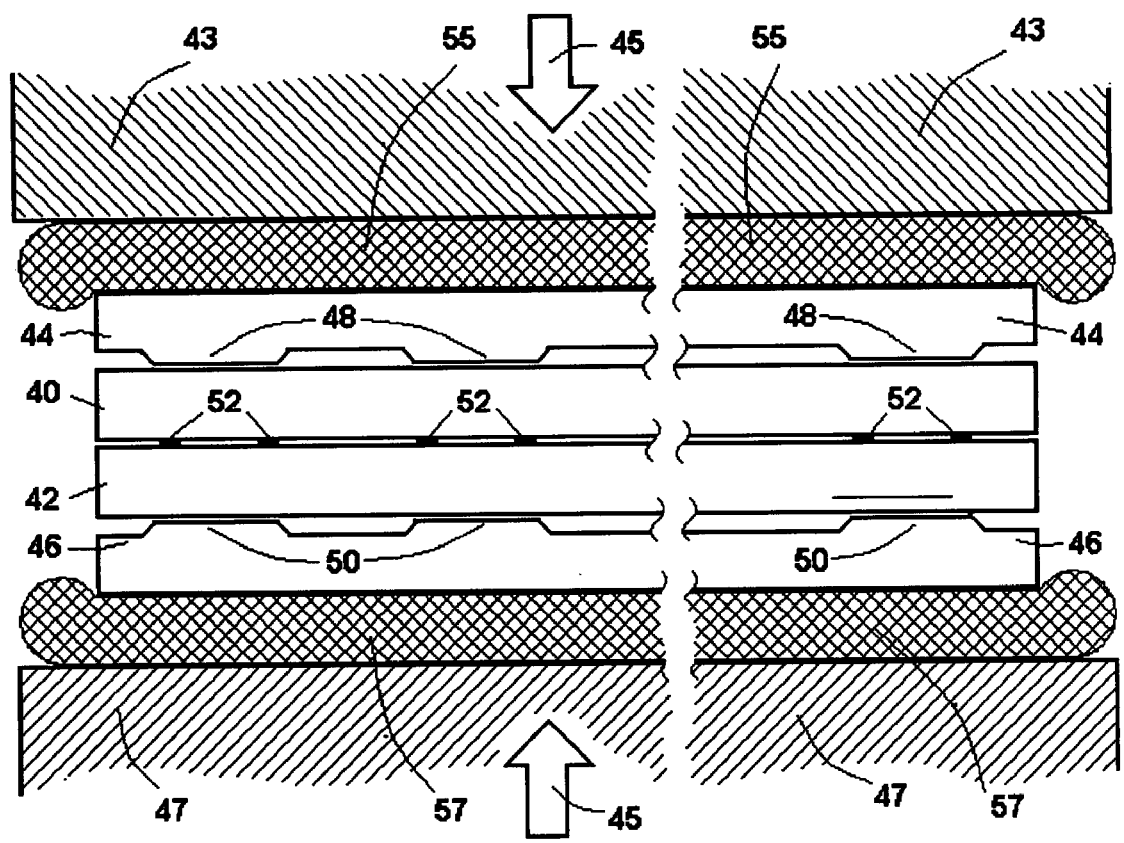
FIG. 7 shows bonding sandwich formed by two wafers aligned for bonding, two micromachined force-transposing substrates and two compliant force-distributing members.

FIG. 7 illustrates wafer-to-wafer bonding method according to the second embodiment. Bonding wafers 40 and 42 are aligned to each other. Two profiled force-transposing substrates 44 and 46 are placed above and below the stack of bonding wafers 40, 42. The force-transposing substrates 44 and 46 have transposers 48, 50 aligned to the bonding areas 52. Two compliant force-distributing members 55 and 57 are added to the bonding sandwich between the top and bottom force-transposing substrates 44, 46 and the platens 43, 47 correspondingly.

The purpose of the compliant force-distributing members is to provide a uniform distribution of force at the interface with the force-transposing substrates. Without the compliant force-distributing members the forces are transferred from the platens 43, 47 to the force-transposing substrates 44, 46 non-uniformly due to roughness of both the platens and the force-transposing substrates and due to thickness variation of the bonding stack consisting of the bonding wafers 40, 42 and the force-transposing substrates 44, 46.

Figure 8:
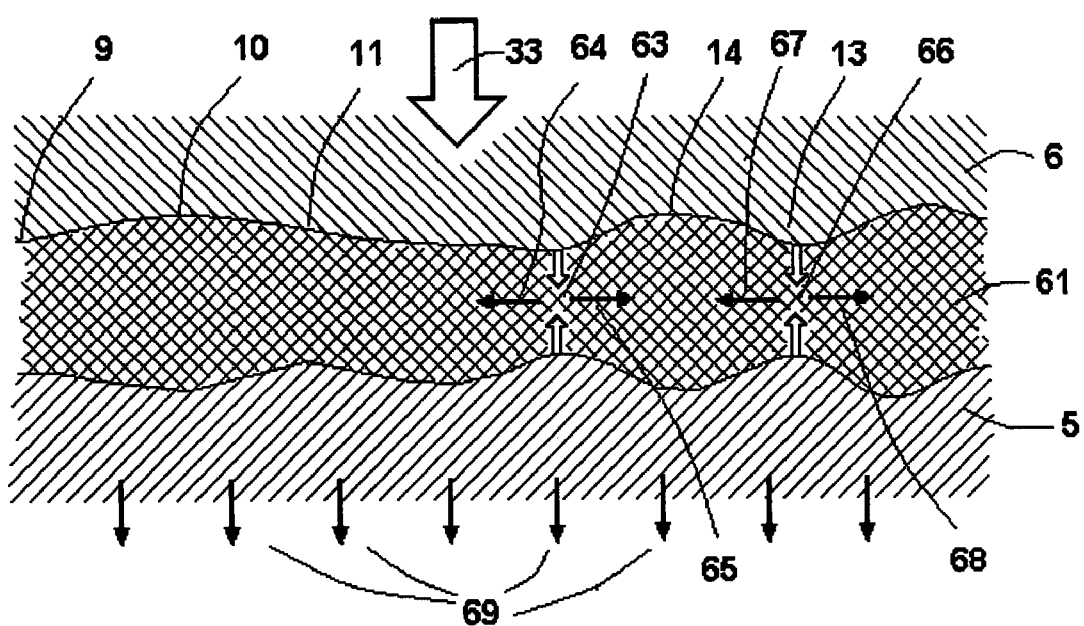
FIG. 8 illustrates deformation of a compliant force-distributing member under load during bonding process.

Compliant force-distributing members 55, 57 are designed to redistribute its material in the direction of stress gradient under an external force loading. This property is illustrated by FIG. 8, which shows a small portion of platen 6 and force-transposing substrate 5 separated by a layer of compliant force-distributing member 61. Surfaces of both platen 6 and force-distributing member 5 are not flat and without the compliant force-distributing member 61 these surfaces would have contact only in small areas. When an external force 33 is applied to the platen 6 it is transferred to the interface 9-10-11-14 between the platen 6 and the compliant force-distributing member 61. Non-uniform load initially applied to the compliant force-distributing member 61 causes redistribution of the compliant material of the force-distributing member due to stress gradients from areas 63 and 66 as shown by arrows 64, 65, 67, and 68. Redistribution of material of the force-distributing member 61 results in a uniform load 69 applied to the force-transposing substrate 5.

Combination of uniform load applied to the force-transposing substrates 44 and 46 shown in FIG. 7 and transposing of the load by the transposers 48, 50 to the bonding areas 52 during bonding process results in uniform and reproducible bonding between wafers 40 and 42.

Different types of compliant materials can be used in force-distributing members, including: fabrics made from high-temperature materials like graphite or glass fibers; high-temperature polymer wafers, films or tapes, made from Teflon®, polyimide and other high-temperature materials; rubber and silicones; bags with sand, powder, low-temperature alloys, or fabrics; soft metal foil, for example Au or Cu foil, and combination of the above.

Multi-layer compliant materials also can be used. Structure containing metal foil-silicone-metal foil, as well as stack of perforated tapes, can be the examples of multi-layer compliant materials.

Compliant force-distributing members also prevents damage of both the bonding wafers 40, 42 and force-transposing substrates 44, 46 by the platens 43, 47.

Compliant force-distributing members can be used on one side and on both sides of the bonding wafers.

Third Embodiment

At least two wafers are provided for bonding in the method of wafer-to-wafer bonding according to the third embodiment. Bonding material is deposited on at least one of the bonding wafers and patterned at the next step. Patterning of the bonding material defines bonding areas. After that bonding sandwich is formed by aligning bonding wafers, bringing them in contact and fixing. At least one force-distributing and transposing member is added to the bonding sandwich at the next step. The force-distributing and transposing member is a compliant object with transposers. Transposers consist of embedded stiff objects surrounded by a compliant material. When loaded with a force, the compliant material is redistributing in the direction of stress gradient. Transposers transfer an external force applied to the bonding sandwich to the local areas on the bonding wafers. The force-distributing and transposing member is aligned to the bonding wafers in such a way that transposers are aligned to the bonding areas. Uniform and reproducible wafer bonding is achieved by applying temperature and force to the described above bonding sandwich.

Figure 9:
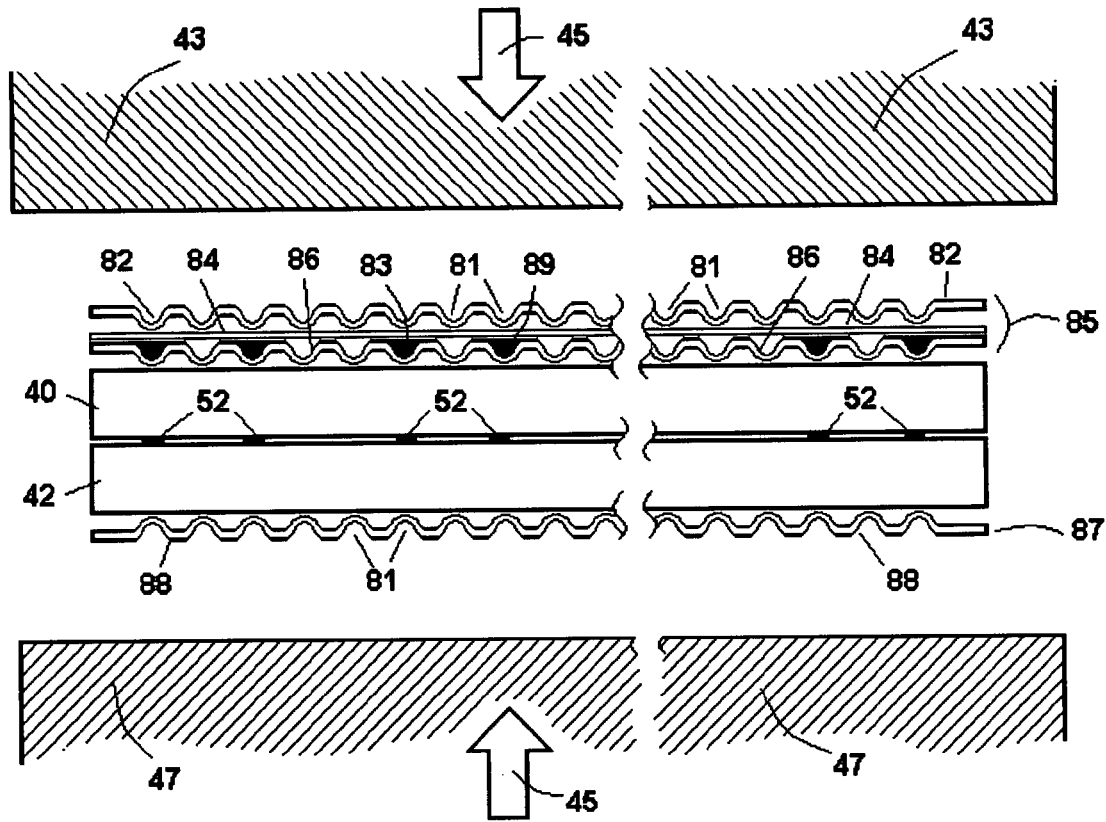
FIG. 9 shows bonding sandwich formed by two wafers aligned for bonding and multiple stamped force-distributing members.

FIG. 9 shows bonding sandwich formed according to the method of wafer-to-wafer bonding disclosed in the third embodiment. The sandwich consists of bonding wafers 40 and 42 aligned to each other and two compliant force-distributing and transposing members 85 and 87 applied to the top and bottom of the bonding sandwich.

The compliant force-transposing and distributing members 85, 87 are made from a combination of metal foil 82, 86, 88 and thin sheets 84. Being loaded with a mechanical load 45 from the platens 43, 47, the force-transposing and distributing members 85, 87 deform and redistribute the load uniformly across the bonding wafers 40, 42. Transposers 83, 89 in the metal foil 86 contain embedded stiff objects surrounded by a compliant material. Transposers 83, 89 are connected by the connecting substrate 86. Layout of the transposers is similar to the layout of the bonding areas 52. The force-transposing and distributing members are aligned to the bonding wafers in such a way that transposers 83, 89 are aligned to the bonding areas 52. Therefore, external force 45 is primarily transferred to the bonding areas 52. The force-transposing and distributing members 85, 87 combine both force-transposing and force-distributing functions.

Figure 10:
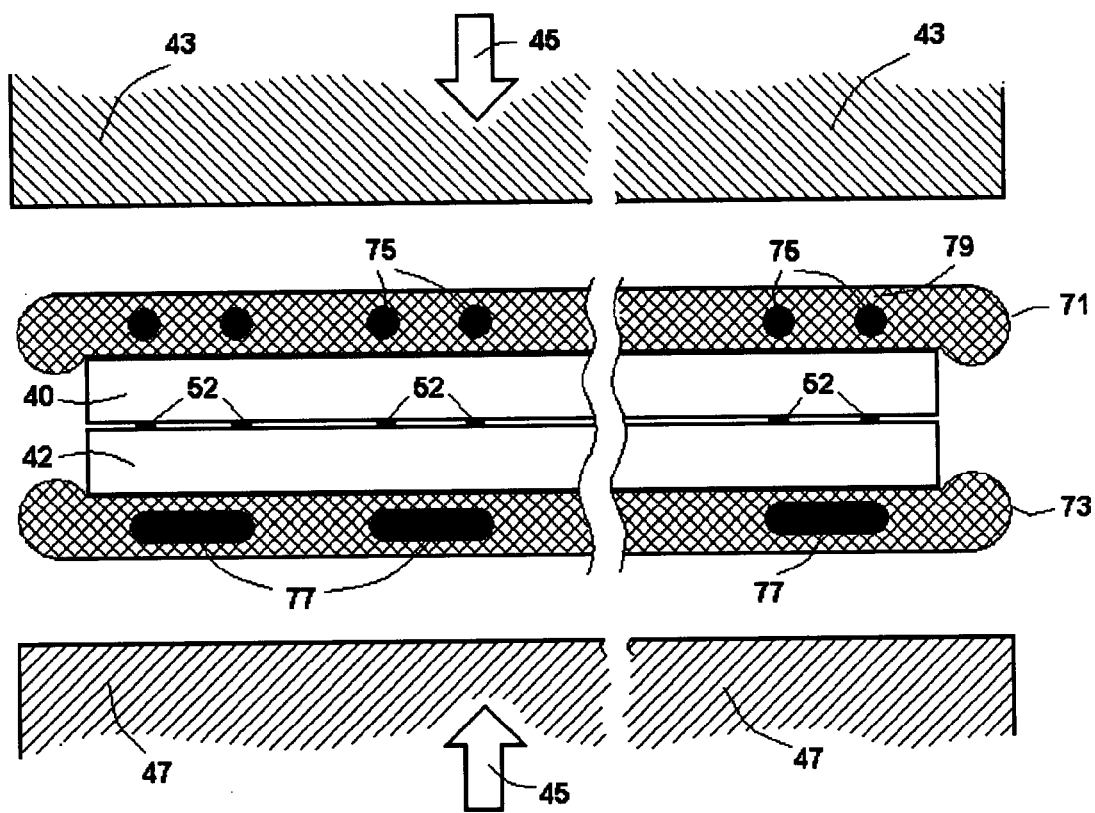
FIG. 10 shows bonding sandwich formed by two wafers aligned for bonding and two force-transposing and distributing members.

FIG. 10 shows another example of bonding sandwich formed by bonding wafers 40 and 42. The bonding wafers are aligned and contact in bonding areas 52. The bonding sandwich further contains two force-transposing and distributing members 71 and 73, which contain an array of transposers. Transposers consist of embedded stiff objects 75, 77 surrounded by a compliant material 79. The stiff objects can have different shapes: spheres, cylinders, disks, plates, and others. The compliant layer 79 is redistributing in the direction of stress gradient under load.

In another embodiment of the invention all embedded stiff objects have the same size and shape and layout of the array of embedded objects 75 and 77 corresponds to the layout of the bonding areas 52 and the force-transposing and distributing members 71 and 73 are aligned to the bonding wafers 40 and 42 in such a way that transposers are aligned with the bonding areas 52. When loaded with an external force 45, the transposers transfer the external force to the local bonding areas 52.

Therefore, as it can be seen from the above description, force-transposing and distributing members 71, 73 combine both force-transposing and force-distributing functions.

Fourth Embodiment

Bonding material is deposited on at least one of bonding wafers in the method of wafer-to-wafer bonding according to the fourth embodiment. Bonding areas are defined at the next step by patterning of the bonding material. Bonding sandwich is formed after that by aligning bonding wafers, bringing them in contact and fixing. At least one compliant force-distributing member is added to the bonding sandwich at the next step. Material of the compliant force-distributing member is redistributing in the direction of stress gradient when an external force is applied. The force-distributing members are positioned on either one or both sides of the bonding stack formed by the bonding wafers. Uniform and reproducible wafer bonding is achieved by applying temperature and force to the described bonding sandwich.

Figure 11:
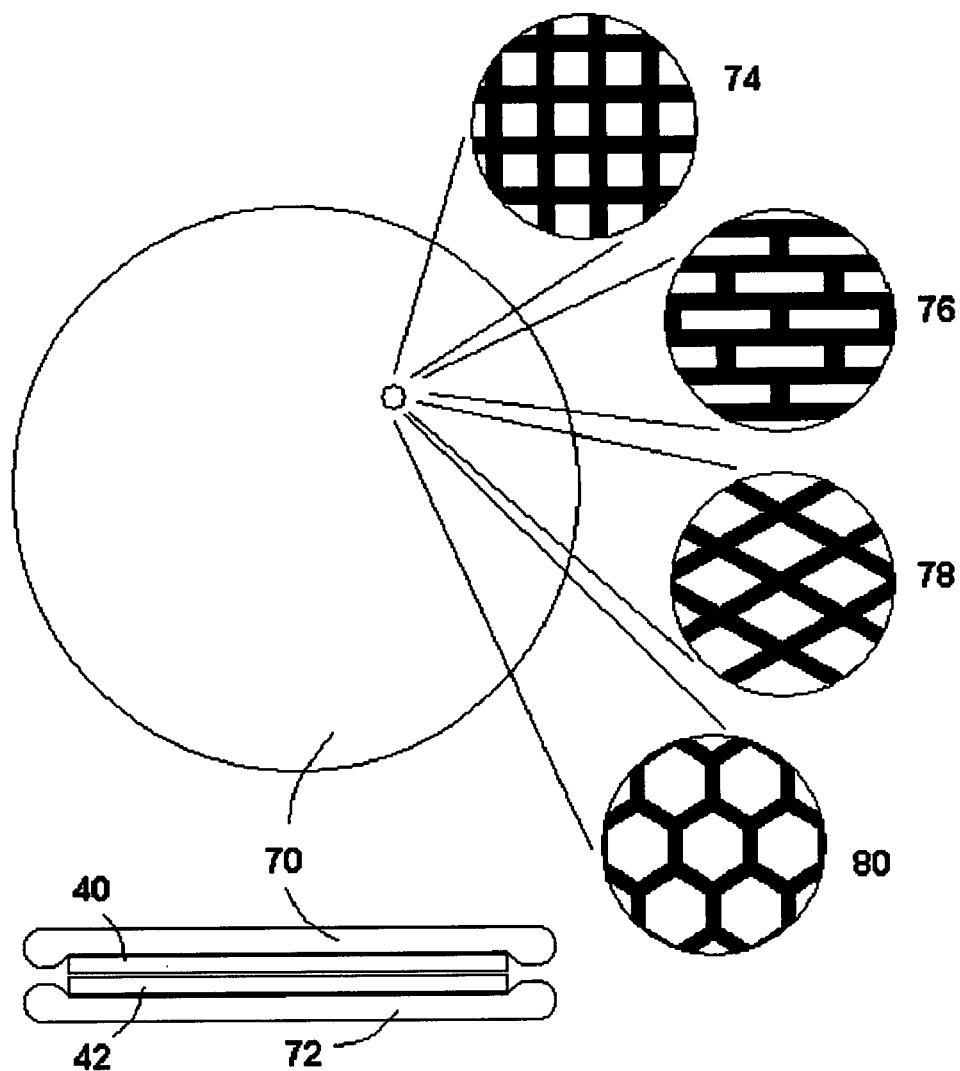
FIG. 11 shows bonding sandwich formed by two wafers aligned for bonding and two force-distributing members and different textures of a force-distributing member.

FIG. 11 shows a bonding sandwich formed according to this embodiment. The sandwich consists of bonding wafers 40 and 42 aligned to each other and two compliant force-distributing members 70 and 72 applied to the top and bottom of the bonding wafers.

Different types of compliant materials can be used in force-distributing members, including: fabrics made from high-temperature materials like graphite or glass fibers; high-temperature polymer wafers, films or tapes, made from Teflon®, polyimide and other high-temperature materials; rubber and silicones; bags with sand, powder, low-temperature alloys, or fabrics; soft metal foil, for example Au or Cu foil, and combination of the above.

Multi-layer compliant materials also can be used. Structure containing metal foil-silicone-metal foil, as well as stack of perforated tapes, are examples of multi-layer compliant materials.

Compliant materials with different texture can be used in force-distributing members as illustrated in FIG. 11. The texture can be characterized by a grid with square cells 74, a grid with rectangular cells 76, a grid with rhombic cells 78 or a grid with hexagonal cells 80. Other textures of material of the force-distributing members also can be used.

Fifth Embodiment

Simultaneous bonding in different areas of the bonding wafers is very important for achieving uniform and reproducible bonding with low built-in stress. This is achieved by providing uniform temperature field and by choosing optimum ramping of load and temperature during bonding process. Uniformity of temperature field is achieved by using multiple heaters and multiple temperature sensors within platens of the bonder.

Figure 12:
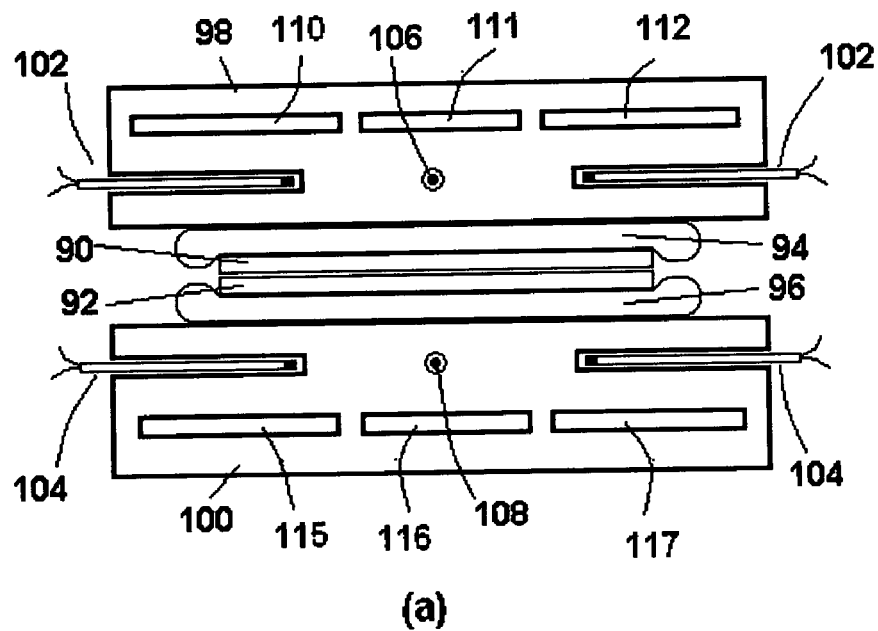
FIG. 12 shows a schematic design of platens with temperature sensors for temperature distribution control during wafer bonding process.
Figure 12:
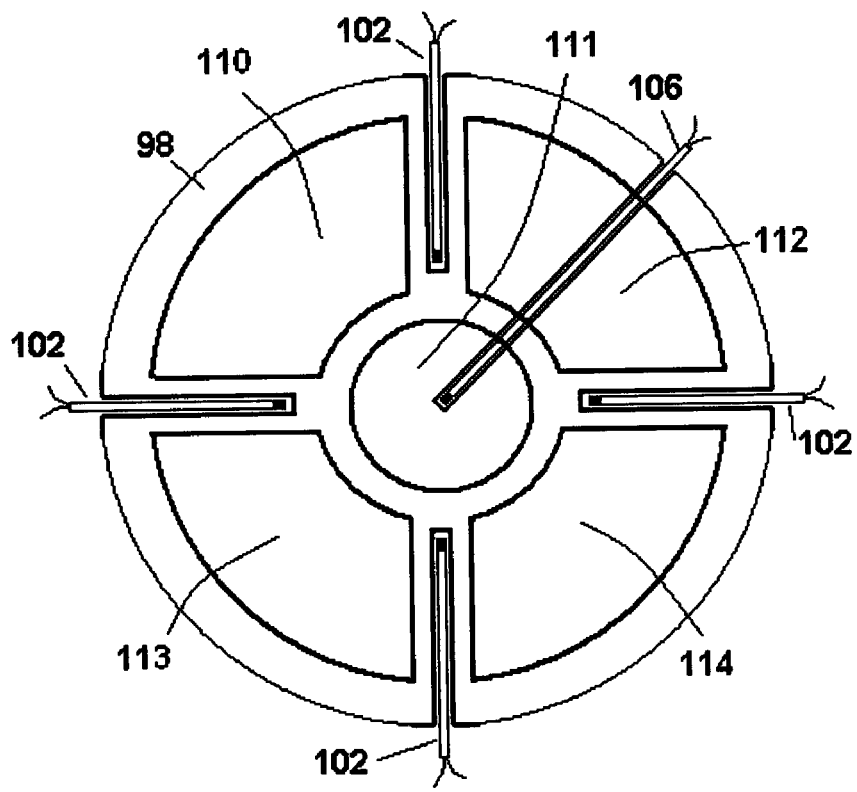

FIG. 12 illustrates method of wafer-to-wafer bonding according to this embodiment. Bonding sandwich contains wafers 90 and 92 aligned for bonding. Compliant force-distributing and transposing members 94 and 96 are placed on top and bottom of the bonding wafers 90, 92. The bonding sandwich is placed between the platens 98 and 100. Size of the platens is somewhat bigger than the size of the bonding wafers. Both platens 98, 100 contain multiple sectioned heaters or heater arrays. The top platen contains five heaters 110-114 shown in FIG. 12b and bottom platen also contains five heaters, three of which 115, 116, and 117 are shown in FIG. 12a. The array of thermocouples 102, 106 built into platens 98 and 100 is used for temperature measurements. Distributed heaters and array of thermocouples provide better temperature uniformity control during bonding process. In particular, the arrays of the heaters and thermocouples are used in a temperature control system of the bonding equipment. The temperature control system utilizes at least one feedback control loop providing required temperature distribution across the surface of the bonding wafers.

Wafer-to-wafer bonding processes utilizing force-transposing substrates and force-distributing members consist of elemental process steps, which include the following operations: loading bonding sandwich into a bonder, increasing force, sustaining constant force, decreasing force, increasing temperature, sustaining constant temperature, decreasing temperature, unloading bonding sandwich and combination of the above. Parameters of each elemental step include initial and final temperature for each elemental step, initial and final load for each elemental step, duration of each elemental step, ramping function for load, and ramping function for temperature.

Specific recipe that includes a certain sequence of elemental process steps depends on different factors including type of bonding, mechanical and thermal properties of force-transposing substrates and force-distributing members, size of the bonding area, physical and chemical properties of the bonding material, desired productivity and others.

Examples of the bonding recipes are provided below.

EXAMPLE 1

Load bonding sandwich, containing force-transposing substrate and force-distributing member, into bonding equipment;

Using a fast ramping rate pre-heat the bonding sandwich to a predetermined first intermediate temperature, which is below the target temperature required for bonding;

Apply force equal to the target bonding force to the bonding sandwich;

Using a slow ramping rate increase temperature to the target temperature for the bonding process;

Keep the bonding sandwich at the target bonding temperature for a pre-determined time;

Cool down the bonding sandwich to a predetermined second intermediate temperature Reduce and remove force Unload the bonding sandwich

EXAMPLE 2

Load bonding sandwich formed according to the present invention, for example the bonding sandwich containing force-transposing and distributing member, into pre-heated bonding equipment (loading temperature);

Apply a predetermined small force to the bonding sandwich to provide good thermal contact to platens;

Keep the bonding sandwich at the loading temperature for a predetermined period of time;

Using a predetermined ramping rates increase simultaneously the temperature and force to the target values;

Reduce and remove force

Cool down the bonding sandwich to the loading temperature

Unload the bonding sandwich

A wide variety of different recipes can be used to implement wafer-to-wafer bonding process according to the present invention depending on type of bonding, mechanical and thermal properties of force-transposing substrates and force-distributing members, size of the bonding area, physical and chemical properties of the bonding material.

A plurality wafers can be bonded in one bonding step.

Adhesion between the bonding material and the bonding wafers can be improved by using layers deposited on the bonding wafers before applying the bonding material for providing the maximum bonding strength. Another method includes treatment of the bonding areas on the surface of bonding wafers before applying the bonding material. The treatment can include plasma cleaning, plasma etching, plasma activation, chemical cleaning, chemical etching, chemical activation, ultrasonic cleaning, megasonic cleaning, application of adhesion promoter, laser activation, annealing and combination of the above.

The methods described in the present invention provide more uniform, more reproducible and stronger bonding between two or more wafers. Therefore, it allows both decreasing bonding area while providing the same bond strength due to stronger bonding and increasing yield due to better uniformity of bonding. Better uniformity of bonding decreases the tolerance of the device parameters and increases yield of semiconductor or micromechanical devices fabricated with a process that includes the wafer bonding step. Smaller size of the bonding area and better yield decrease the cost of the die.

While this invention has been described fully and completely with special emphasis upon the preferred embodiments, it should be understood that within the scope of the appended claims the invention may be practiced otherwise than as specifically described herein.

We claim:

1. A method of wafer to wafer bonding comprising the steps of:
   providing at least two wafers to be bonded;
   providing at least one force-transposing substrate comprising a connecting substrate and transposers having contacting areas and having the thickness larger than the thickness of the connecting substrate;
   applying bonding material to at least one of the wafers and creating predetermined bonding areas in selected locations;
   aligning at least two wafers for bonding and at least one force-transposing substrate;
   providing a predetermined sequence of the external force loading and temperature steps for creating bonds between the wafers in the bonding areas,
   wherein the transposers on the force-transposing substrate form an array having layout corresponding to the layout of the bonding areas and the array of transposers redistributes the external force loading to the bonding areas providing uniform and reliable bonding across the wafers.

2. The method of claim 1, wherein the material of the transposers and connecting substrate is chosen from the group of: metal, semiconductor, ceramic, plastic, glass, polymer and combination.

3. The method of claim 1, wherein the force-transposing substrate has two sides, at least one side is profiled and the profiled side is facing one of the bonding wafers.

4. The method of claim 1, wherein the bonding areas have a repeatable pattern with a size and a pitch on the surface of the bonding wafers and at least some of the transposers have the same pitch and the size of contacting areas is selected relative to the size of the corresponding bonding areas.

5. The method of claim 1, wherein the bonding material is chosen from the group of materials consisting of: metal, alloy, solder, fit glass, polymer, adhesive and combination of the above.

6. The method of claim 1, wherein the bonding areas include bonding patterns in the bonding wafers areas not occupied with functional dice, including alignment marks, test structures and periphery of the bonding wafers.

7. The method of claim 1, wherein bonding areas on the surface of bonding wafers are treated before applying the bonding material; said treatment is chosen from the group of processes consisting of: plasma cleaning, plasma etching, plasma activation, chemical cleaning, chemical etching, chemical activation, ultrasonic cleaning, megasonic cleaning, application of adhesion promoter, laser activation, annealing and combination of the above.

8. The method of claim 1, wherein a predetermined sequence of the force loading and temperature steps includes multiple elemental operations chosen from the group of operations consisting of: increasing force, sustaining constant force, decreasing force, increasing temperature, sustaining constant temperature, decreasing temperature and combination of the above.

9. The method of claim 1, further comprising an environment, during the bonding process, characterized by a composition of substances and pressure, wherein said composition of substances is chosen from the group consisting of: gas, liquid, air, nitrogen, inert gas and combination of the above.

10. The method of claim 1, wherein temperature, provided during wafer bonding process, has a predetermined distribution on the surface of the bonding wafers chosen from the group of distributions consisting of: uniform, non-uniform concentric, non-uniform eccentric, with extremum of temperature in the selected areas of the wafer or combination.

11. The method of claim 1, wherein at least one of the bonding wafers is a force-transposing substrate.

12. A method of wafer to wafer bonding comprising the steps of:
   providing at least two wafers to be bonded;
   providing at least one force-transposing substrate comprising connecting substrate and transposers having contacting areas;
   providing at least one compliant force-distributing member;

applying bonding material to at least one of the wafers and creating predetermined bonding areas in selected locations;

aligning at least two wafers for bonding and the at least one force-transposing substrate;

applying the at least one compliant force-distributing member to the at least one force-transposing substrate;

providing a predetermined sequence of external force loading and temperature steps for creating bonds between the wafers in the predetermined bonding areas, wherein the compliant force-distributing member redistributes its material across a surface of the force-transposing substrate in the direction of stress gradient, when external force loading is applied, providing distribution of pressure on the surface of the force-transposing substrate and therefore on the predetermined bonding areas.

13. The method of claim 12, wherein the material of compliant force-distributing member is chosen from the group of: graphite, glass fiber, plastic, polymer, polyimide, rubber, silicone, sand, powder, metal, soft alloy, liquid, and combination of the above.

14. The method of claim 12, wherein the compliant force-distributing member is chosen from the group of: one-layer sheet, multi-layered sheet, fabric, flat foil, perforated foil, profiled foil, tape, perforated tape, profiled tape, bag, pillow, mat and combination of the above.

15. The method of claim 12, wherein the force-distributing member provides uniform pressure distribution on the surface of the force-transposing substrate.

16. The method of claim 12, wherein the bonding areas have a repeatable pattern with a size and a pitch on the surface of the bonding wafers and at least some of the transposers have the same pitch and the size of contacting areas is selected relative to the size of the corresponding bonding areas.

17. The method of claim 12, further comprising:
positioning the at least one compliant-distribution member relative to a non-bonding surface of a first wafer of the at least two wafers such that the at least one compliant-distribution member is separated from a second wafer of the at least two wafers to be bonded with the first wafer by at least the first wafer and wherein the at least one compliant-distribution member is not bonded with the first wafer or second wafer.

18. The method of claim 12, wherein the bonding material is chosen from the group of materials consisting of: metal, alloy, solder, fit glass, polymer, adhesive and combination of the above.

19. The method of claim 12, wherein the bonding areas include bonding patterns in the bonding wafers areas not occupied with functional dice, including alignment marks, test structures and periphery of the bonding wafers.

20. The method of claim 12, wherein a predetermined sequence of the force loading and temperature steps includes multiple elemental operations chosen from the group of operations consisting of: increasing force, sustaining constant force, decreasing force, increasing temperature, sustaining constant temperature, decreasing temperature and combination of the above.

21. A method of wafer to wafer bonding comprising the steps of:
providing at least two wafers to be bonded;
providing at least one force-transposing and distributing member comprising a connecting member, made from compliant material, and transposers having contacting areas and containing stiffeners embedded within the compliant material;
the connecting member holds all the transposers;
applying bonding material to at least one of the wafers and creating predetermined bonding areas in selected locations;
aligning at least two wafers for bonding and at least one force-transposing and distributing member;
providing a predetermined sequence of the force loading and temperature steps for creating bonds between the wafers in the bonding areas,
wherein the compliant connecting member redistributes its material across the surface of transposers in the direction of stress gradient, when external force loading is applied, providing uniform distribution of pressure on the surface of transposers, which form an array having layout corresponding to the layout of the bonding areas, and the force-transposing and distributing member uniformly redistributes external force loading to the bonding areas providing reliable bonding across the wafers.

22. The method of claim 21, wherein the material of compliant connecting member is chosen from the group of: graphite, glass fiber, plastic, polymer, polyimide, rubber, silicone, sand, powder, metal, soft alloy, liquid, and combination of the above.

23. The method of claim 21, wherein the connecting member is chosen from the group of: one-layer sheet, multi-layered sheet, fabric, flat foil, perforated foil, profiled foil, tape, perforated tape, profiled tape, bag, pillow, mat and combination of the above.

24. The method of claim 21, wherein the material of the stiffeners within transposers is chosen from the group of: metal, semiconductor, ceramic, plastic, glass, polymer and combination of the above.

25. The method of claim 21, wherein the shape of the stiffeners within transposers is chosen from the group of: sphere, cylinder, cone, pyramid, parallelepiped, plate, ellipsoid, washer, tore and combination of the above.

26. The method of claim 21, wherein the bonding material is chosen from the group of materials consisting of: metal, alloy, solder, fit glass, polymer, adhesive and combination of the above.

27. The method of claim 21, wherein the bonding areas are created with a process chosen from the group of processes consisting of: photolithography, screen printing, contact printing, spraying with a shadow mask, etching of the deposited material through a shadow mask, laser assisted deposition, dispensing, laser-assisted patterning, e-beam patterning and combination of the above.

28. The method of claim 21, wherein the bonding areas include bonding patterns in the bonding areas not occupied with functional dice, including alignment marks, test structures and periphery of the bonding wafers.

29. The method of claim 21, further comprising:
positioning the at least one force-transposing and distributing member relative to a first wafer of the at least two wafers such that the at least one force-transposing and distributing member is separated from a second wafer of the at least two wafers by at least the first wafer and wherein the at least one force-transposing and distributing member is not bonded with the at least two wafers.

30. A method of wafer to wafer bonding comprising the steps of:
providing at least two wafers to be bonded;
providing at least one compliant force-distributing member;
applying bonding material to at least one of the wafers and creating bonding areas;
aligning at least two wafers for bonding;

applying at least one compliant force-distributing member to at least one wafer for bonding where the compliant force-distribution member is not bonded with any of the at least two wafers;

providing a predetermined sequence of the force loading and temperature steps resulting in creating bonds between the wafers in the bonding areas, wherein the compliant force-distributing member redistributes its material across the surface of the bonding wafer in the direction of stress gradient, when external force loading is applied, providing uniform distribution of pressure across the surface of the bonding wafers.

31. The method of claim 30, wherein the material of compliant force-distributing member is chosen from the group of: graphite, glass fiber, plastic, polymer, polyimide, rubber, silicone, sand, powder, soft metal, soft alloy, liquid, and combination of the above.

32. The method of claim 30, wherein the compliant force-distributing member is chosen from the group of:

one-layer sheet, multi-layered sheet, fabric, flat foil, perforated foil, profiled foil, tape, perforated tape, profiled tape, bag, pillow, mat and combination of the above.

33. The method of claim 30, wherein the force-distributing member provides uniform pressure distribution on the surface of the bonding wafer.

\* \* \* \* \*

UNITED STATES PATENT AND TRADEMARK OFFICE
CERTIFICATE OF CORRECTION

PATENT NO. : 7,659,182 B2  Page 1 of 1
APPLICATION NO. : 11/804863
DATED : February 9, 2010
INVENTOR(S) : Vaganov et al.

It is certified that error appears in the above-identified patent and that said Letters Patent is hereby corrected as shown below:

In the CLAIMS:
Claim 5, column 12, line 23, delete "fit" and insert --frit--.
Claim 18, column 13, line 46, delete "fit" and insert --frit--.
Claim 26, column 14, line 38, delete "fit" and insert --frit--.

Signed and Sealed this

Twenty-seventh Day of April, 2010

David J. Kappos
*Director of the United States Patent and Trademark Office*